(12) United States Patent
Rothenberg et al.

(10) Patent No.: US 6,778,733 B2
(45) Date of Patent: Aug. 17, 2004

(54) LITHOGRAPHIC FABRICATION OF PHASE MASK FOR FIBER BRAGG GRATINGS

(75) Inventors: Joshua E. Rothenberg, Fremont, CA (US); Yunlong Sheng, Fremont, CA (US)

(73) Assignee: Teraxion Inc., Sainte-Foy (CA)

( * ) Notice: Subject to any disclaimer, the term of this patent is extended or adjusted under 35 U.S.C. 154(b) by 70 days.

(21) Appl. No.: 09/883,081

(22) Filed: Jun. 15, 2001

(65) Prior Publication Data

US 2002/0122626 A1 Sep. 5, 2002

Related U.S. Application Data

(60) Provisional application No. 60/260,104, filed on Jan. 5, 2001.

(51) Int. Cl.[7] .................................. G02B 6/34
(52) U.S. Cl. .............................. 385/37; 430/5
(58) Field of Search ................. 385/37; 405/5

(56) References Cited

U.S. PATENT DOCUMENTS

| | | | |
|---|---|---|---|
| 5,376,483 A | * 12/1994 | Rolfson | 430/5 |
| 5,388,173 A | 2/1995 | Glenn | |
| 5,982,963 A | 11/1999 | Feng et al. | |
| 6,057,065 A | * 5/2000 | Rolson | 430/5 |
| 6,084,995 A | 7/2000 | Clements et al. | |
| 6,093,507 A | * 7/2000 | Tzu | 430/5 |
| 6,200,711 B1 | * 3/2001 | Kurihara et al. | 430/5 |
| 6,549,705 B1 | * 4/2003 | Laming et al. | 385/37 |

FOREIGN PATENT DOCUMENTS

| | | |
|---|---|---|
| GB | 2333018 A | 7/1999 |
| JP | 11160511 | 6/1999 |
| WO | WO 99/22256 | 5/1999 |
| WO | WO 99/63371 | 12/1999 |

OTHER PUBLICATIONS

Qiu Y et al: "Optimal Phase Mask for Fiber Bragg Grating Fabrication", Journal of Lightwave Technology, vol. 17, No. 11, Nov. 1999, pp. 2366–2370.
PCT International Search Report, Appl. No. PCT/US 02/00241, Oct. 16, 2002.

* cited by examiner

Primary Examiner—Robert H. Kim
Assistant Examiner—Richard H Kim
(74) Attorney, Agent, or Firm—Fulbright & Jaworski LLP

(57) ABSTRACT

The invention provides masks that form fiber Bragg gratings (FBGs) in optical fibers without stitching errors from re-scaling or re-positioning. The invention feathers the pixels of the mask lines by adding, removing, and/or displacing one or more pixels from the edges of the bars and spaces of the mask. The feathering of pixels will affect the FBG being written into the fiber. The feathering operates to shift the effective edge of the bars. This allows the achievement of much finer resolution FBGs than the pixel size of the mask.

56 Claims, 3 Drawing Sheets

LITHOGRAPHIC FABRICATION OF PHASE MASK FOR FIBER BRAGG GRATINGS

RELATED APPLICATIONS

The present application claims priority of benefit to Provisional Application No. 60/260,104, filed Jan. 5, 2001, entitled "LITHOGRAPHIC METHODS OF DIFFRACTION MASK FABRICATION FOR FIBER BRAGG GRATINGS," the disclosure of which is hereby incorporated herein by reference.

TECHNICAL FIELD

The present invention related in general to fiber Bragg gratings, and in specific to method and apparatus for producing masks that are used to create fiber Bragg gratings.

BACKGROUND

Normal optical fibers are uniform along their lengths. A slice from any one point of the fiber looks like a slice taken from anywhere else on the fiber, disregarding tiny imperfections. However, it is possible to make fibers in which the refractive index varies regularly along their length. These fibers are called fiber gratings because they interact with light like diffraction gratings. Their effects on light passing through them depend very strongly on the wavelength of the light.

A diffraction grating is a row of fine parallel lines, usually on a reflective surface. Light waves bounce off of the lines at an angle that depends on their wavelength, so light reflected from a diffraction grating spreads out in a spectrum. In fiber gratings, the lines are not grooves etched on the surface, instead they are variations in the refractive index of the fiber material. The variations scatter light by what is called the Bragg effect, hence fiber Bragg gratings (FBGs). Bragg effect scattering is not exactly the same as diffraction scattering, but the overall effect is similar. Bragg scattering reflects certain wavelengths of light that resonate with the grating spacing while transmitting other light.

FBGs are used to compensate for chromatic dispersion in an optical fiber. Dispersion is the spreading out of light pulses as they travel on the fiber. Dispersion occurs because the speed of light through the fiber depends on its wavelength, polarization, and propagation mode. The differences are slight, but accumulate with distance. Thus, the longer the fiber, the more dispersion. Dispersion can limit the distance a signal can travel through the optical fiber because dispersion cumulatively blurs the signal. After a certain point, the signal has become so blurred that it is unintelligible. The FBGs compensate for chromatic (wavelength) dispersion by serving as a selective delay line. The FBG delays the wavelengths that travel fastest through the fiber until the slower wavelengths catch up. The spacing of the grating is chirped, changing along its length, so that different wavelengths are reflected at different points along the fiber. These points correspond to the amount of delay that the particular wavelengths need to have so that dispersion is compensated. Suppose that the fiber induces dispersion such that a longer wavelength travels faster than a shorter wavelength. Thus, a longer wavelength would have to travel farther into the FBG before being reflected back. A shorter wavelength would travel less far into the FBG. Consequently, the longer and shorter wavelengths can be made coincidental, and thus without dispersion. FBGs are discussed further in Feng et al. U.S. Pat. No. 5,982,963, which is hereby incorporated herein by reference in its entirety. A circulator is used to move the reflected beam onto an different path from the input beam.

FBGs are typically fabricated in two manners. The first manner uses a phase mask. The phase mask is quartz slab that is patterned with a grating. The mask is placed in close proximity with the fiber, and ultraviolet light, usually from an ultraviolet laser, is shined through the mask and onto the fiber. As the light passes through the mask, the light is primarily diffracted into two directions, which then forms an interference pattern on the fiber. The interference pattern comprises regions of high and low intensity light. The high intensity light causes a change in the index of refraction of that region of the fiber. Since the regions of high and low intensity light are alternating, a FBG is formed in the fiber. See also Kashyap, "Fiber Bragg Gratings", Academic Press (1999), ISBN 0-12-400560-8, which is hereby incorporated herein by reference in its entirety.

The second manner is known as the direct write FBG formation. In this manner two ultraviolet beams are impinged onto the fiber, in such a manner that they interfere with each other and form an interference pattern on the fiber. At this point, the FBG is formed in the same way as the phase mask manner. One of the fiber and the writing system is moved with respect to the other such that FBG is scanned or written into the fiber. Note that the two beams are typically formed from a single source beam by passing the beam through a beam separator, e.g. a beamsplitter or a grating. Also, the two beams are typically controlled in some manner so as to allow control over the locations of the high and low intensity regions. For example, Laming et al., WO 99/22256, which is hereby incorporated herein by reference in its entirety, teaches that the beam separator and part of the focusing system is moveable to alter the angle of convergence of the beams, which in turn alters the fringe pitch on the fiber. Another example is provided by Glenn, U.S. Pat. No. 5,388,173, and Stepanov et al., WO 99/63371, which are hereby incorporated herein by reference in their entirety, and teach the use of an electro-optic module, which operates on the beams to impart a phase delay between the beams, which in turn controls the positions of the high and low intensity regions.

Each manner has advantages and disadvantages when compared with each other. For example, the first manner, the phase mask manner, is relatively inflexible, as changes cannot be made to the mask. However, since the phase mask is permanent, the phase mask manner is stable, repeatable, and aside from the cost of the mask, relatively inexpensive to operate. On the other hand, the direct write manner is very flexible, and can write different gratings. However, this manner is less repeatable and is costly to operate.

Another problem with the phase mask manner resides in the fabrication of the masks. Masks are fabricated by lithographic or holographic techniques. The mask slab is coated on its surface with light or particle (electron or ion) sensitive or photosensitive material (resist). Under the resist, the slab may also be coated with a metallic layer (e.g. chrome) to assist conduction of charged particles away from the exposed regions. Regions or bars of the resist are illuminated by light or particle beam according to a desired pattern, which is generally an array of parallel bars along a straight line with precisely selected positions. This illumination causes chemical changes in the exposed regions of resist. The exposed resist can be preferentially removed from the slab by a chemical or plasma, which does not strongly affect the unexposed resist (or vice versa). After the preferential removal of the resist according to the desired pattern, the slab may then be etched by a different chemical or plasma which preferentially etches the slab where the resist has been removed. The etched portions of the slab have a difference in thickness or height from the un-etched portions. When the etched (bars) and un-etched (spaces) portions are patterned to form an array along a straight line, the differences in thicknesses form a phase grating. Thus, by applying an array of bars and spaces on the slab to form a grating, a phase mask will be formed. Other lithography tools can directly etch the bars and spaces onto the mask rather than in resist. In another embodiment, these regions can have alternate transmittance properties, such as by the presence or absence of an opaque material (e.g. chrome), and thus form an amplitude grating. Note that in all these cases, the critical part of the fabrication is the exposure of the bars and spaces (or direct etching of the bars and spaces). The resulting mask is limited by the quality and precision of the exposure process.

Current lithographic techniques used in the fabrication of phase masks have a limitation referred to as 'stitching error'. This originates from repositioning and re-magnification errors, which have the effect of slightly misplacing the periodic structure required in the mask. New optical and e-beam lithography tools have the capability to write continuous patterns (so called cursive writing) effectively without such stitching errors. However, the currently practiced state of the art cannot utilize cursive writing to make masks for chirped FBGs and/or FBGs with phase shifts (positional shifts of the bars or spaces, or changes in the bar or space widths), without the introduction of stitching errors.

SUMMARY OF THE INVENTION

These and other objects, features, and technical advantages are achieved by a system and method system which uses current lithography tools to fabricate masks without stitching errors from re-scaling or re-positioning. The masks fabricated by the invention will generate the linear or non-linear chirp, and other phase shifts as desired, in the fiber Bragg grating (FBG) in the core of the fiber.

The invention preferably uses the pixelation of the resist exposure or direct etching. The invention preferably 'feathers' the pixels of the mask lines by adding, removing, and/or displacing one or more pixels. Thus, the bars of the mask are not smooth and continuous (at the pixel resolution), but rather have pixels added, removed, and/or displaced at the edges of the bars. This addition, removal, and/or displacement of pixels will affect the FBG being written into the fiber. Since the fiber is operating single mode, any variations in the location of the written index modulation, which is transverse to the fiber axis, will be averaged out over the core diameter. In other words, a single position is defined which is the effective location of each periodic variation (edge) of the index modulation in the core. This allows the achievement of much finer resolution FBGs than the pixel size of the mask, because of the averaging effect that occurs with the feathering of the edges of the mask bars.

Thus, the invention preferably achieves a resolution that is 1/N of one pixel, where N is the number of pixels used to form a bar in a direction that is transverse from the fiber axis. This fine resolution allows fine details to be encoded in the FBG that is formed in the fiber. Such details could include linear and non-linear chirps in the pitch of the grating, and arbitrary discrete or continuous phase variations. That is, the position of the bars and spaces can be positioned according to any desired pattern with resolution improved by a large factor over conventional methods, and without the introduction of stitching errors.

The invention also uses a focusing lens system, which is used to focus the light through the mask and onto the fiber. This allows a larger portion of the mask to be illuminated by the light source; larger in the direction that is transverse from the fiber axis. This, in turn, allows for more illuminated pixels on a given bar to be focused and thus averaged in the formation of the grating within the fiber, which provides even greater resolution. That is the larger number of pixels, N, which are effectively illuminated and focused onto the core of the fiber, the better the possible resolution. Since the focusing need only be in the direction orthogonal to the fiber axis, it is preferable to have the focusing lens system comprise at least one cylindrical lens.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

Figure 1:
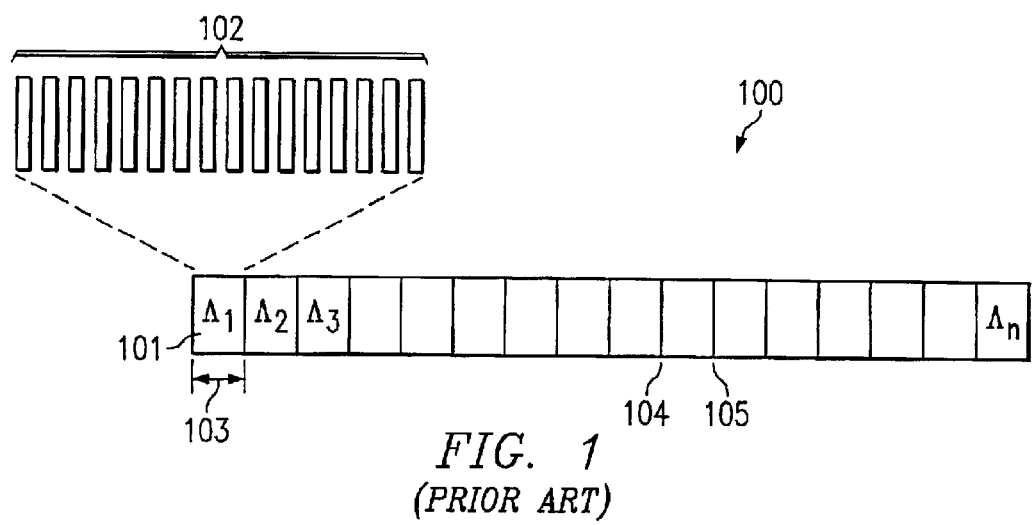
FIG. 1 depicts a prior art mask.

Before describing the invention, a review of the prior art is considered helpful. Note that the variation of the index in the core of an FBG can be written as $$n(z)=n_0+n_g \cos(2\pi z/\Lambda_g(z)+\phi_g(z)), \qquad (1)$$

where $n_0$ is the average effective index of refraction of the fiber core, $n_g$ is the amplitude of the index grating modulation, $\phi_g$ is the grating phase, and for a chirped FBG the pitch $\Lambda_g(z)$ of the grating varies as either a linear or nonlinear function of z. The FBG is phase matched to resonantly reflect the Bragg wavelength $\lambda_B=2n_0 \Lambda_g$, and thus at the standard telecommunications wavelength $\lambda_B=1550$ nm, with $n_0=1.45$ one finds that $\Lambda_g\sim535$ nm.

The side illumination technique using a mask for writing FBGs relies on the interference in the fiber produced by the $+1^{st}$ and $-1^{st}$ orders of the mask. As a result, the pitch of the grating on the mask is reduced by exactly a factor of two when written into the fiber grating. Thus, the surface height of the mask can be written as:

$$h(z)=h_0\sin\left(\left[2\pi z/\Lambda_m(z)+\phi_m(z)\right]\right), \quad (2)$$

where the mask pitch $\Lambda_m(z)=2\Lambda_g(z)$ and phase $\phi_m(z)=\phi_g(z)/2$. Note that the sinusoidal shape is assumed for the purposes of illustration, as typically the mask surface corrugation function is a square wave shape.

The current way to fabricate such a surface relief mask is to use lithography to write a periodic structure of bars (exposed) and spaces (unexposed) on resist, which is developed and the underlying fused silica preferentially etched according to the pattern of bars and spaces. The problem is that the pixel address size (the digital increment of position that can be programmed into the writing beam) of the lithographic tools is at minimum 5 nm and more typically 25 nm or larger (most FBG masks today use 100 nm pixels). For a chirped FBG the change in pitch is only on the order of 5 pm per mm of travel along the z-axis, which is well below the resolution that can be achieved by the addition or removal of a single pixel. As a result, the current lithographic art is incapable of making a continuously chirped mask. An alternative technology is that of holography, where two optical beams interfere in resist to form the exposure. This method also has its disadvantages in that it cannot easily generate arbitrary (e.g. nonlinear) chirps nor discrete phase shifts.

Consequently, the current method of writing chirped FBGs uses a mask that is formed from butt-coupled segments where the pitch varies from one segment to the next, but within each segment the pitch is constant. For the typical FBG of bandwidth $\sim1$ nm, if the segments are less than about 1 mm long, then the performance of such a piecewise constant pitch grating will be equivalent to that of a continuously chirped grating. Therefore, the current method for making chirped masks with lithography tools is to pattern sections about 1 mm long, each of which have a constant pitch within. The lithography tools have the capability to apply a scaling factor to such a section with very high accuracy, and thus the same pattern is written over and over again with slightly different scalings (pitch). Thus one can choose a pitch $\Lambda_0$ for the segment for which the bars and spaces can be represented by an exact integral number of pixels; and then an arbitrary pitch $\Lambda$ can be written by applying a highly accurate scaling factor S so that $\Lambda=S\times\Lambda_0$.

A chirped mask can thus be written by butt-coupling many such scaled sections together to make a mask of arbitrary length. FIG. 1 depicts such a mask structure 100. This mask structure 100 will create chirped FBGs in fibers. The mask comprises a plurality of segments, e.g. 103, with each different segment having a different scaled pitch. Within each segment the pitch is uniform, namely $\Lambda_1$, where $\Lambda_i=S_i\times\Lambda_0$, where $S_i$ is a scaling constant, for the $i^{th}$ segment. The scale factor $S_i$ can be varied on current lithographic tools to high accuracy.

However, each time a new section is written, the tool must be re-registered at the new position, which leads to a positioning error. In addition, there is an error associated with the resealing process itself. Both of these effects lead to a so called 'stitching error', typically on the order of 5–20 nm. The error arises at the interface between adjacent segments, e.g 104 and 105. These stitching errors can lead to significant degradation of chirped FBG performance.

In contrast, the invention creates masks, even masks that will produce chirped FBGs, with standard lithographic tools, which avoids the above procedure of repositioning and rescaling, and hence eliminates or reduces stitching error. Note that as stated above, to achieve a chirped FBG, the mask structure needs to have changes in pitch down to the few pm scale. Thus, assuming a pixel address size of 5 nm, this would require attaining effective resolution at about $1/1000$ of the size of a pixel.

The desired grating is written in the core of a fiber, which has a diameter of about 10 $\mu$m (for fibers operating at $\sim1550$ nm). Since the fiber is operating single mode, any variations in the location of the written index modulation transverse to the fiber axis will be averaged out over the core diameter, i.e. a single position which is the effective location of each periodic variation (edge) of the index modulation in the core can be defined. Taking advantage of this averaging effect, by 'feathering' an edge of a bar of the mask will allow much finer resolution than the pixel size. Feathering is where one or more pixels are added, removed, or shifted on the edges of the bars and spaces.

Figure 2:
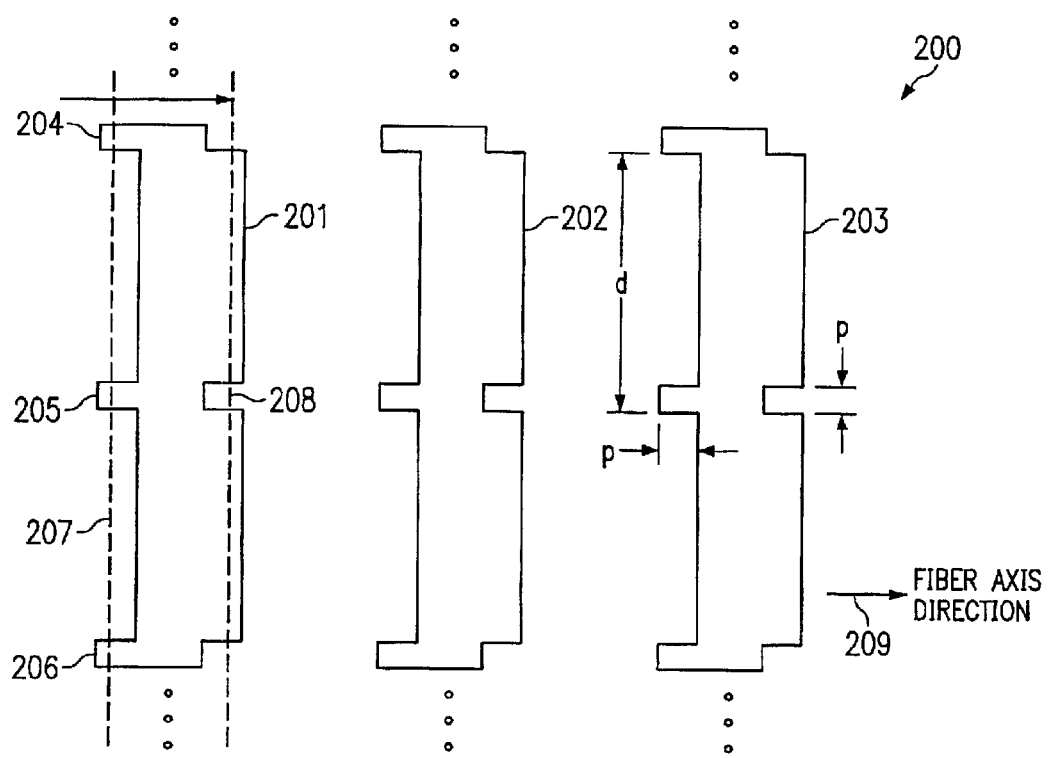
FIG. 2 depicts an embodiment of the inventive mask.

FIG. 2 depicts an example of 'feathering' of a mask 200, wherein each bar 201, 202, 203 has three pixels shifted, e.g. 204, 205, 206 in a direction that is parallel with the fiber axis direction 209. The pixel size is p, and by adding or removing a single pixel periodically with period d along the edge of a bar (transverse to the axis of the fiber), the effect of transverse averaging is to effectively shift the edge of the bar by a distance equal to that of a pixel width reduced by its transverse duty cycle (the width of a single pixel divided by the number of pixels in the transverse period d, $N=d/p$). In addition to the transverse averaging of the fiber core, the spot size limit of the lithography writing beam is generally larger than the address size, which can further assist the averaging effect. Based on this simple model for an ideal writing system, the effective shift of the bar edge from a single pixel p per transverse period d is $\Delta z=p/N=p^2/d$. Note that shifting a pixel can involve removing a pixel on one edge by itself, and/or adding a pixel to the opposite edge, or an entire line of pixels can be added, removed, and/or shifted over by one. In any event, shifting a pixel can result in effectively moving one or both edges of a bar, one 207 away from the bar, and the other 208 into the bar.

For example, assume $p=5$ nm, and allow for a minimum of only 1 pixel shifted along the full extent of the fiber core ($d=10$ $\mu$m), then the duty cycle of a single shifted pixel is $1/2000$, and the minimum effective shift of the bar edge would be $\Delta z=p^2/d=2.5$ pm. This shift represents a small fraction of a pitch period in the fiber, $\Delta z/\Lambda_g\sim0.0025$ nm/535 nm=4.7× $10^{-6}$, or a phase shift of $2\pi\Delta z/\Lambda_g=2.9\times10^{-5}$ radians. In practice, to avoid any dependency of the averaged shift on the actual relative position of the fiber core to the mask, it is preferable to have at least a few pixels over the core diameter. Even if the lithography tool has a larger pixel size $p=25$ nm, then the minimum duty cycle increases to $\sim1/400$ and the minimum shift is still only $\Delta z=p^2/d=63$ pm, $\Delta z/\Lambda_g\sim0.063$ nm/535 nm=$1.2\times10^{-4}$, or a phase shift of $7.3\times10^{-4}$ radians. With such small incremental phase shifts it is possible to construct a chirped grating without using any resealing or segmenting.

As an example, consider a linearly chirped grating with a bandwidth of 0.5 nm and a chirp rate of 0.1 nm/cm of the Bragg wavelength along the fiber. For this grating:

$$\Lambda_g(z)=\Lambda_{g0}-\alpha z, \text{ for } -2.5<z<2.5 \text{ cm}, \quad (3)$$

where $\alpha=0.1/2n_0=0.035$ nm/cm is the chirp rate, and $\Lambda_{g0}\sim535$ nm is the average pitch of the FBG. This can be approximated by a linear variation of the inverse pitch of the fiber grating $$\Lambda^{-1}{}_g(z)=\Lambda_{-1\ g0}+\alpha z/\Lambda^2{}_{g0}, \text{ for } -2.5<z<2.5 \text{ cm}, \quad (4)$$

Such a linear chirp is produced by a quadratic variation in the phase of the index modulation, $$n(z)=n_0+n_g \cos (2\pi z/\Lambda_{g0}+\phi_g(z)), \quad (5)$$

where the chirp is given by $$2\pi(\Lambda^{-1}{}_g(z)-\Lambda^{-1}{}_{g0})=d\phi_g(z)/dz \quad (6)$$

and thus the required phase is $$\phi_g(z) = 2\pi\alpha z^2/2\Lambda^2{}_{g0}, \text{ for } -2.5 < z < 2.5 \text{ cm}. \quad (7)$$
$$= 3.8z^2 \text{ radians}$$

From Eq. (7) it is noted that the maximum rate of phase change is 18.9 rad/cm at the ends of this chirped FBG. Therefore, the phase variation over a single pitch in the fiber is 535 nm×18.9 rad/cm 1.0×10$^{-3}$ rad. As a result, the feathering technique described has adequate resolution to essentially continuously track the phase of the chirp, even where the phase varies most rapidly.

Figure 3A:
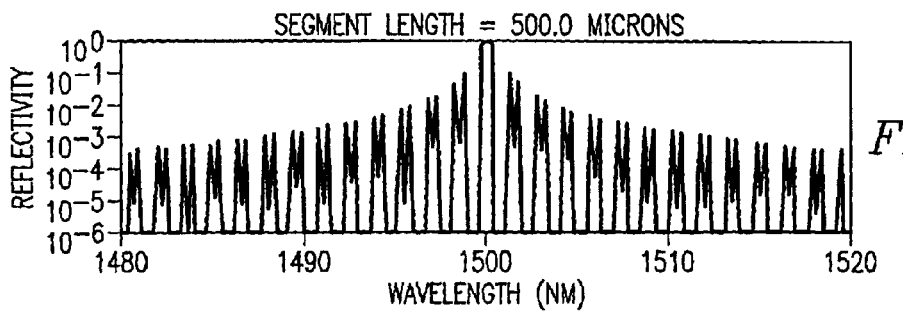
FIGS. 3A–3E depict the reflectivity of the different embodiments of the inventive mask.
Figure 3B:
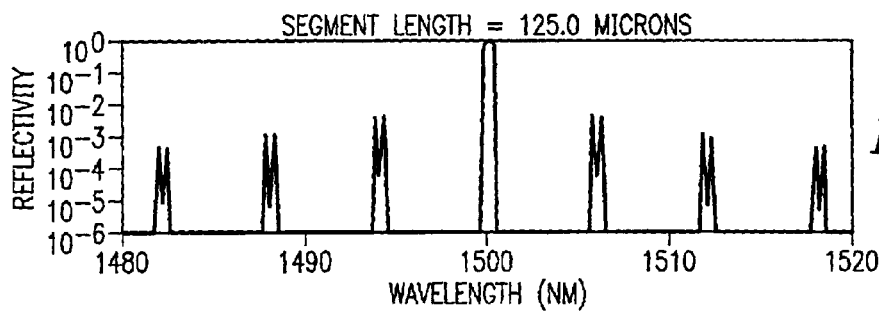
Figure 3C:
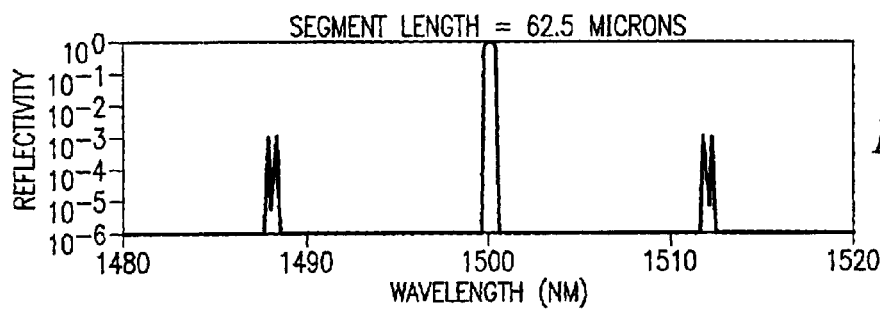
Figure 3D:
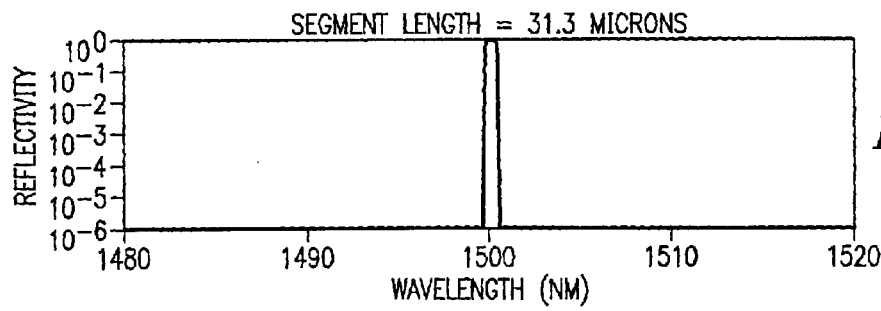
Figure 3E:
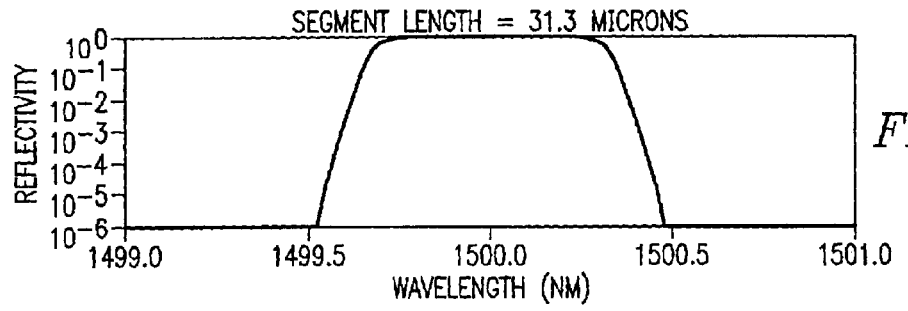

In practice, continuous tracking of the phase is not necessary. If one butt couples regions of equal and constant pitch, but each of which has a phase shift according to Eq. (7), then the grating response is adequate over the 0.5 nm bandwidth if $\Delta z<1$ mm. However the periodic phase errors from this piecewise constant phase approach lead to a periodic side lobe structure which has a frequency spacing of 0.08 nm/$\Delta z$, where $\Delta z$ is in cm. These results are shown in FIGS. 3A–3E. These FIGURES depict the calculated reflectivity using grating segments with constant pitch, each phase shifted according to Eq. (7). FIG. 3A depicts 500 μm segment lengths. FIG. 3B depicts 125 μm segment lengths. FIG. 3C depicts 62.5 μm segment lengths. FIG. 3D depicts 31.3 μm segment lengths. FIG. 3E depicts 31.3 μm segment lengths with a magnified scale. If $\Delta z$ is smaller than ~30 μm, then the side lobes are separated by ~25 nm, and can thus be pushed outside of the commonly used C-band of Erbium doped optical fiber amplifiers.

Whether the phase of the bar-space pattern is varied continuously or in a discrete fashion, the feathering technique allows the attainment of ~pm resolution for the effective relative positions of the bars without varying the magnification scale factor and/or re-registering the lithography stage position. Thus, the Bar-Space pair with m pixels per transverse interval d shifted from one edge of the bar to the other edge as BS$^m$, will have an effective positional shift of m$\Delta z$, where $\Delta z=p^2/d$ and m can vary from 0 up to N=d/p. When all the pixels have shifted to the opposing edge, this results in the conventional shift of a single pixel, and then shifting can be cyclically continued over again. Given a desired phase function for the grating as in Eq. (7), the positional shift δ of each bar can be defined as a function of z, $$\delta(z)=\phi_g(z)\Lambda_{g0}/2\pi \quad (8)$$

Figure 4:
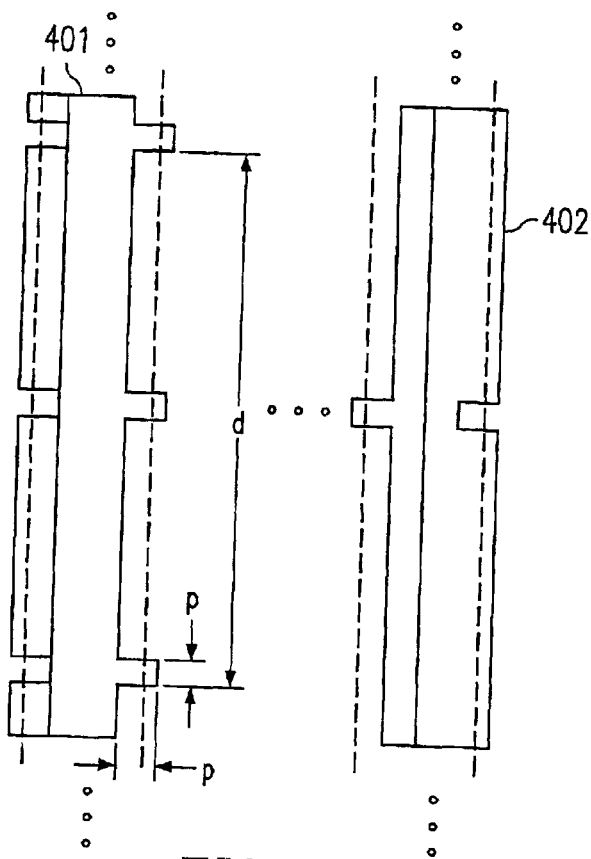
FIG. 4 depicts another embodiment of the inventive mask.

The number of pixels shifted at each bar position is then given by $$m(z)=\delta(z)/(p^2/d) \quad (9)$$

where m>d/p indicates that there is a complete shift of $\delta(z)/p$ pixels, plus [m(z) mod d/p] pixels 'feathered' over the interval d. FIG. 4 depicts an example of cyclic movement of the pixels from one edge of a bar to another across the mask.

In bar 401, most of the pixels have already been shifted, e.g. only two remain, within the periodic interval d, where m=d/p-2. In this case, note that the effective shift is $\Delta z$=m p$^2$/d. In bar 402 an entire column of pixels has been moved from one edge to the other and the shifting is repeating, beginning with a single pixel being shifted, where m=1. Hence, the effective shift is $\Delta z$=p+m p$^2$/d. The effect of writing beam size and other effects in the lithography tool may cause the variation of effective shift δ(z) versus the number of shifted pixels m to deviate from the simple linear relationship expressed in Eq. (9). For example, the effect of resolution will be very different for two pixels that are adjacent versus two which are not. As a result one may be required to calibrate this effect in some way to appropriately select m(z).

If this scheme is used to continuously modify the phase (position) of each bar, then the grating will have the pattern $$BS^{m1}BS^{m2} \ldots BS^{mi} \quad (10)$$

where m$_i$ is given by Eq. (9) evaluated at the position of each bar. If phase changes only over an interval corresponding, for example, to j repetitions of the Bar-Space period, the grating would have the pattern $$[BS^{m1}]^j[BS^{m2}]^j \ldots [BS^{mi}]^j \quad (11)$$

where $[BS^{mi}]^j$ indicates j repetitions of the BS$^{mi}$ pattern. Either changing the phase continuously or over a given interval, the positional resolution is determined by the limit of the feathering technique $\Delta z=p^2/d$.

This technique is easily adapted to incorporate discrete phase shifts. If at any point along the fiber a discrete phase shift $\Delta\phi$ is required, one simply incorporates a gap of the appropriate width $$\delta=\Delta\phi\Lambda_{g0}/2\pi \quad (12)$$

at the location desired. The only limitation will be the resolution limit, i.e. it is required that $\delta>>\Delta z=p^2/d$. Note, however, that for the special case where the phase shift is an integral or rational fraction of π, a shift corresponding to a full pixel width without feathering may suffice exactly. For example, if a π shift is desired in the FBG, then $\delta=\Lambda_g/2=\Lambda_m/4$. Hence, if the basic BS period is a multiple of 4 pixels, a gap of ¼ of the BS period on the mask will be an integral number of pixels and will generate exactly the desired π/2 phase shift in the mask, and π shift in the FBG.

Note that the use of these new techniques may be combined with the currently practiced resealing method to achieve a significant reduction in the number of stitching errors. For example, if a chirped grating requires many phase shifts every millimeter, then the current art would require repositioning every shift. This leads to many more stitching errors than are required for writing a simple chirped grating (for which resealing is needed only every ~1 mm). One can therefore use pixel shifts as described above to generate phase shifts at whatever frequency is required (e.g. every 50 μm), yet rescale only according to that which is required by the chirp (every ~1 mm). In this case each segment would have the general form $$Seg_k=[BS^{m1k}]^{j1k}\delta_{1k}[BS^{m2k}]^{j2k}\delta_{2k}\ldots{}_l[BS^{mlk}]^{jlk}\delta_{jk} \quad (13)$$

where $\delta_{lk}$ are the required phase shift gaps as per Eq. (12). Each segment pattern Seg$_k$ could then be scaled by an arbitrary factor S$_k$, as in the currently practiced art. This would then accomplish an arbitrary number of phase shifts while maintaining the number of resealing typically used for a conventionally chirped FBG. However, since the rescaling will still lead to stitching errors, it would generally be preferred to use the feathering technique over the entire pattern without any rescaling.

Figure 5:
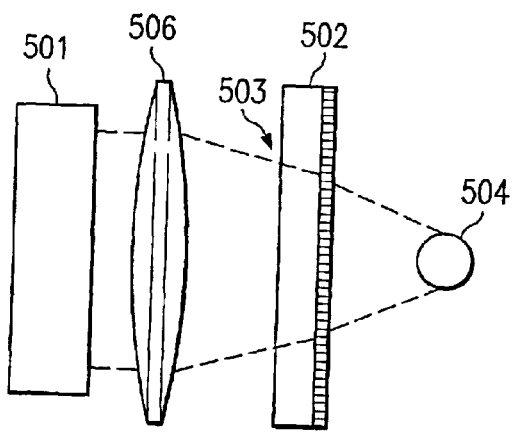
FIG. 5 depicts an example of an arrangement to write a fiber Bragg grating into a fiber using the inventive mask.

FIG. 5 depicts an example of a system configured to use the inventive mask 502 to record a FBG onto the core of a fiber 504. A light source 501, e.g. ultraviolet laser, would provide the input beam. A phase mask 502, constructed as described above, separates the light beam into two first order diffracted beams, which project out of the plane of the FIGURE. These two interfering $1^{st}$ order diffracted beams form the grating within the fiber core.

Focusing lens 506 is used to focus the light through the mask and onto the fiber core. This allows a larger portion 503 of the mask 502 to be illuminated by the light source beam; larger in the direction that is transverse from the fiber axis. This, in turn, allows for more illuminated pixels on a given bar to be focused and thus averaged in the formation of the grating within the fiber core, which provides even greater resolution. That is, if the light beam, which is focused onto the approximately 10 $\mu$m size of the fiber core, has a much larger size when it passes through the mask, the period d can be much larger than 10 $\mu$m. Thus the beam can have many periods d within the beam, so that good averaging is maintained. The number of pixels, N=d/p, which are effectively illuminated and focused onto the core of the fiber, can be larger and therefore better resolution (a smaller effective shift of a single pixel $p/N=p^2/d$) can be obtained. Since the focusing need only be in the direction orthogonal to the fiber axis, it may be preferable to have the focusing lens system comprise at least one cylindrical lens.

Figure 6:
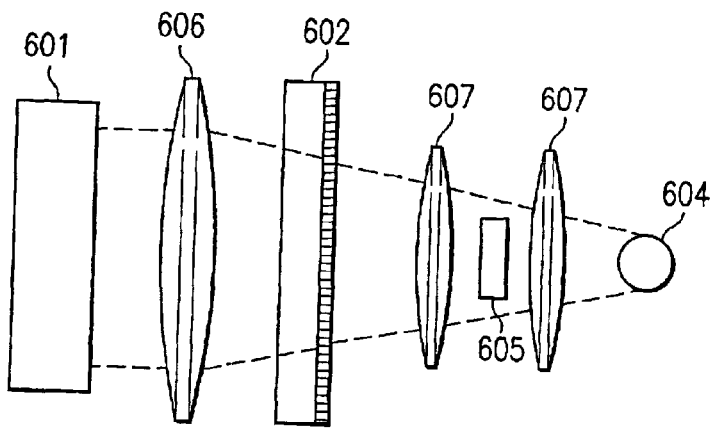
FIG. 6 depicts an example of an alternative arrangement to write a fiber Bragg grating into a fiber using the inventive mask and an additional imaging system.

FIG. 6 depicts another embodiment of a system configured to use the inventive mask 602 to record a FBG onto the core of a fiber 604. As in FIG. 5, a light source 601, e.g. ultraviolet laser, would provide the input beam. A phase mask 602, constructed as described above, separates the light beam into two first order diffracted beams, which project out of the plane of the FIGURE. Beam focusing lens 606 is used to focus the light through the mask and onto the fiber core. In this embodiment, the arrangement is supplemented by an optical imaging system between the mask and fiber, which may consist of one or more lenses 607. This optical system images the two first order diffracted beams emanating from the mask onto the fiber core to form the FBG within the core. A stop 605 may be used to block a zero order beam, if present, emanating from mask 602. Note that if there is no zero order beam, then a stop does not need to be used. Note that the imaging is only necessary for the direction along the fiber (out of the plane of FIG. 6). Therefore the one or more imaging lenses 607 need only be cylindrical, oriented to focus rays going out of the plane of the page. If lens or lenses 607 are cylindrical and oriented as described, then the beam focusing lens or lenses 606 can be cylindrical and orthogonally oriented, and then can be independently adjusted to focus the beams on the fiber core without being affected by the one or more imaging lenses 607.

Note that the invention has been described in terms of forming a phase mask. However, the inventive feathering may also be used in forming an absorption mask, wherein the feathering is printed onto the surface of the substrate as dark bars. These bars would have different transmission or transmittance than the spaces. Such a mask can be used to form an interference pattern by diffracting the light of an incoming beam into two beams, similarly to that of a phase mask.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An optical mask comprising:
   a plurality of bars arranged in a period array along a first axis of the mask, with spaces between adjacent bars;
   wherein each of the bars have substantially regular lateral edges contiguous to said spaces; and
   wherein at least one bar includes at least one predetermined irregularity on at least one lateral edge wherein the one irregularity is operative to effectively shift the one lateral edge in a direction that is orthogonal to the lateral edge.

2. The optical mask of claim 1 wherein the one irregularity shifts the one lateral edge by an amount that is related to a size of the one irregularity.

3. The optical mask of claim 1 wherein the mask is a phase mask, and the bars have a different thickness in the direction of an optical axis of the mask than the spaces.

4. The optical mask of claim 1 wherein the mask is an absorption mask, and the bars have a different transmittance than the spaces.

5. The optical mask of claim 1 wherein the bars are formed from a plurality of pixels.

6. The optical mask of claim 5 wherein the irregularity is an extra pixel.

7. The optical mask of claim 6 wherein the irregularity is operative to effectively shift the one lateral edge in a direction that is away from the bar by an amount that is the size of the extra pixel divided by the number of pixels on the one lateral edge.

8. The optical mask of claim 5 wherein the irregularity is a missing pixel.

9. The optical mask of claim 8 wherein the irregularity is operative to effectively shift the one lateral edge in a direction that is into the bar by an amount that is related to the size of the missing pixel divided by the number of pixels on the one lateral edge.

10. The optical device of claim 5 wherein the irregularity is a shifted pixel located on one lateral edge which has been shifted from an opposite lateral edge of the bar from the one lateral edge.

11. The optical device of claim 10 wherein:
   the irregularity is operative to effectively shift the one lateral edge in a direction that is away from bar by an amount that is related to the size of the shifted pixel divided by the number of pixels on the one lateral edge; and
   the irregularity is operative to effectively shift the other lateral edge in a direction that is orthogonal to the lateral edge and into the bar by an amount that is related to the size of the shifted pixel divided by the number of pixels on the other lateral edge.

12. An optical system for writing a grating into an optical fiber, wherein the optical fiber is located at an output plane of the optical device, the optical system comprising:
 a beam generator that provides an input beam; and
 a beam separator that receives an input beam and separates the input beam into a plurality of beams;
 wherein the plurality of beams interfere with each other at the output plane to form an interference pattern that is used to form the grating; and
 wherein the beam separator includes an optical mask comprising:
  a plurality of bars arranged in a period array along a first axis of the mask, with spaces between adjacent bars;
  wherein each of the bars have substantially regular lateral edges contiguous to said spaces; and
  wherein at least one bar includes at least one predetermined irregularity on at least one lateral edge operative to effectively shift the one lateral edge in a direction that is orthogonal to the one lateral edge.

13. The optical system of claim 12 wherein the one irregularity shifts the one lateral edge by an amount that is related to a size of the one irregularity.

14. The optical system of claim 12 wherein the mask is a phase mask and the bars have a different thickness in the direction of an optical axis of the beam separator mask than the spaces.

15. The optical system of claim 12 wherein the mask is an absorption mask, and the bars have a different transmittance than the spaces.

16. The optical system of claim 12 wherein the bars are formed from a plurality of pixels.

17. The optical system of claim 16 wherein the irregularity is an extra pixel.

18. The optical system of claim 17 wherein the irregularity is operative to effectively shift the one lateral edge in a direction that is away from the region by an amount that is the size of the extra pixel divided by the number of pixels on the one lateral edge.

19. The optical system of claim 16 wherein the irregularity is a missing pixel.

20. The optical system of claim 19 wherein the irregularity is operative to effectively shift the one lateral edge in a direction that is into the region by an amount that is related to the size of the missing pixel divided by the number of pixels on the one lateral edge.

21. The optical system of claim 16 wherein the irregularity is a shifted pixel located on one lateral edge which has been shifted from an opposite lateral edge of the polygon shape from the one lateral edge.

22. The optical system of claim 21 wherein:
 the irregularity is operative to effectively shift the one lateral edge in a direction that is away from the region by an amount that is related to the size of the shifted pixel divided by the number of pixels on the one lateral edge; and
 the irregularity is operative to effectively shift the opposite edge in a direction that is orthogonal to the lateral edge and into the region by an amount that is related to the size of the shifted pixel divided by the number of pixels on the other lateral edge.

23. The optical system of claim 12 wherein the grating is a Bragg grating.

24. The optical system of claim 12 wherein the input beam is an ultraviolet input beam.

25. The optical system of claim 12 wherein the beams separator forms the plurality of beams by diffracting the input beam into two first order beams.

26. The optical system of claim 25 wherein the device further comprises:
 a stop which blocks a zero order diffracted beam.

27. The optical system of claim 12 further comprising:
 a focusing lens system that focuses the input beam through the beam separator, thereby focusing the plurality of beams onto the output plane.

28. The optical system of claim 27 wherein:
 the beam separator is larger than a core of the optical fiber in a direction that is orthogonal to the optical axis of the fiber.

29. The optical system of claim 27 wherein the focusing lens system only focuses light in a direction that is orthogonal from the optical axis of the optical fiber.

30. The optical system of claim 29 wherein the focusing lens system comprises a cylindrical lens.

31. The optical system of claim 27 further comprising:
 an optical imaging system between the separator and the output plane that images the plurality of beams onto the output plane.

32. The optical system of claim 31 wherein:
 the beam separator is larger than a core of the optical fiber in a direction that is orthogonal to the optical axis of the fiber.

33. The optical system of claim 31 wherein the imaging system only images light in a direction that is parallel to the optical axis of the optical fiber.

34. The optical system of claim 31 wherein the optical imaging system comprises at least one cylindrical lens.

35. The optical device of claim 12 wherein the grating is a chirped grating.

36. The optical device of claim 35 wherein the grating is a linear chirped grating.

37. The optical device of claim 35 wherein the grating is a non-linear chirped grating.

38. The optical device of claim 12 wherein the grating includes a plurality of discrete phase shifts.

39. The optical device of claim 12 wherein the grating includes a substantially continuous and spatially varying phase shift.

40. A method for writing a grating into an optical fiber, the method comprising:
 providing an input beam; and
 separating the input beam into a plurality of beams;
 interfering the plurality of beams with each other to form an interference pattern that is used to form the grating; and
 wherein the step of separating includes
 providing an optical mask comprising:
  a plurality of bars arranged in a period array along a first axis of the mask, with spaces between adjacent bars;
  wherein each of the bars have substantially regular lateral edges contiguous to said spaces; and
  wherein at least one bar includes at least one predetermined irregularity on at least one lateral edge, which effectively shifts the one lateral edge in a direction that is orthogonal to the lateral edge by an amount that is related to a size of the one irregularity.

41. The method of claim 40 wherein the step of providing the optical mask comprises:
 arranging a plurality of pixels to form each bar.

42. The method of claim 41 wherein the step of providing at least one predetermined irregularity comprises:

adding an extra pixel to the one lateral edge;

wherein the step of adding operates to effectively shift the one lateral edge in a direction that is orthogonal to the lateral edge and away from the region by an amount that is the size of the shifted pixel divided by the number of pixels on the one lateral edge.

43. The method of claim 41 wherein the step of providing at least one predetermined irregularity comprises:

removing a pixel from the one lateral edge;

wherein the step of removing operates to effectively shift the one lateral edge in a direction that is orthogonal to the lateral edge and into the region by an amount that is related to the size of the shifted pixel divided by the number of pixels on the one lateral edge.

44. The method of claim 41 wherein the step of providing at least one predetermined irregularity comprises:

shifting a pixel to the one lateral edge from an opposite lateral edge of the polygon shape from the one edge wherein the step of shifting operates to effectively shift the one lateral edge in a direction that is orthogonal to the lateral edge and away from the region by an amount that is related to the size of the shifted pixel divided by the number of pixels on the one lateral edge, and to effectively shift the other lateral edge in a direction that is orthogonal to the lateral edge and into the region by an amount that is related to the size of the shifted pixel divided by the number of pixels on the other lateral edge.

45. The method of claim 44 wherein the grating is a Bragg grating.

46. The method of claim 40 wherein the input beam is an ultraviolet input beam.

47. The method of claim 40 wherein the step of separating comprises:

diffracting the input beam into a plurality of first order beams.

48. The method of claim 47 wherein the step of separating further comprises:

blocking a zero order diffracted beam.

49. The method of claim 40 further comprising:

focusing the plurality of beams into the optical fiber.

50. The method of claim 49 further comprising:

focusing the plurality of beams in a direction orthogonal from the optical axis of the optical fiber.

51. The method of claim 50 further comprising:

imaging the plurality of beams in a direction parallel to an optical axis of the optical fiber.

52. The method of claim 40 wherein the grating is a chirped grating.

53. The method of claim 40 wherein the grating is a linear chirped grating.

54. The method of claim 40 wherein the grating is a non-linear chirped grating.

55. The method of claim 40 wherein the grating includes a plurality of discrete phase shifts.

56. The method of claim 40 wherein the grating includes a substantially continuous and spatially varying phase shift.

* * * * *